United States Patent
Moise et al.

(10) Patent No.: US 6,734,477 B2
(45) Date of Patent: May 11, 2004

(54) FABRICATING AN EMBEDDED FERROELECTRIC MEMORY CELL

(75) Inventors: Ted Moise, Dallas, TX (US); Scott Summerfelt, Garland, TX (US); Eden Zielinski, Richardson, TX (US); Scott Johnson, Richardson, TX (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 09/925,214

(22) Filed: Aug. 8, 2001

(65) Prior Publication Data

US 2003/0030084 A1 Feb. 13, 2003

(51) Int. Cl.[7] ...................... H01L 21/824; H01L 21/476
(52) U.S. Cl. .................... 257/295; 257/300; 257/303; 257/306; 257/310; 313/303
(58) Field of Search ............................ 257/295, 296, 257/298, 300, 303, 306, 310; 313/303

(56) References Cited

U.S. PATENT DOCUMENTS

| | | | |
|---|---|---|---|
| 5,536,672 A | 7/1996 | Miller et al. | |
| 5,773,314 A | 6/1998 | Jiang et al. | |
| 5,807,774 A | 9/1998 | Desu et al. | |
| 5,902,131 A | 5/1999 | Argos et al. | |
| 5,990,507 A | * 11/1999 | Mochizuki et al. | 257/295 |
| 6,051,858 A | 4/2000 | Uchida et al. | |
| 6,140,672 A | 10/2000 | Arita et al. | |
| 6,174,735 B1 | 1/2001 | Evans | |
| 2002/0063274 A1 | * 5/2002 | Kanaya et al. | 257/310 |
| 2002/0192901 A1 | * 12/2002 | Kimura et al. | 438/253 |

* cited by examiner

Primary Examiner—Minhloan Tran
Assistant Examiner—Thomas L Dickey

(57) ABSTRACT

Integrated circuit structures comprising an embedded ferroelectric memory cell and methods of forming the same are described. These structures include a transistor level, a ferroelectric device level, a first metal level, an inter-level dielectric level and a second metal level. In a first embodiment, the ferroelectric device level is disposed over an isolation layer of the transistor level and an isolation layer of the ferroelectric level has one or more vias that are laterally sized larger than corresponding contact vias extending through the transistor isolation layer and aligned therewith. In a second embodiment, the first metal level and the ferroelectric device level are integrated into the same level. In a third embodiment, the ferroelectric device level is disposed over the first metal level. In a fourth embodiment, the ferroelectric device level is disposed over the inter-level dielectric level that, in turn, is disposed over the first metal level. In a fifth embodiment, the ferroelectric device level is disposed over the transistor isolation layer and the ferroelectric isolation layer has one or more vias extending through the ferroelectric isolation layer and the transistor isolation layer. These embodiments implement different strategies for improving the yield and performance of embedded ferroelectric devices.

10 Claims, 10 Drawing Sheets

FABRICATING AN EMBEDDED FERROELECTRIC MEMORY CELL

CROSS-REFERENCE TO RELATED APPLICATIONS

This application is related to U.S. application Ser. No. 09/702,985, filed Oct. 31, 2000, and entitled "Method of Fabricating A Ferroelectric Memory Cell," which incorporated herein by reference. This application also is related to U.S. application Ser. No. 09/925,223, filed Aug. 8, 2001, by Stephen R. Gilbert et al., and entitled "Forming Ferroelectric Pb(ZrTi)O$_3$ Films" and to U.S. application Ser. No. 09/925,201, filed Aug. 8, 2001, by Stephen R. Gilbert et al., and entitled "Contamination Control for Embedded Ferroelectric Device Fabrication Processes", both of which also are incorporated herein by reference.

TECHNICAL FIELD

This invention relates to systems and methods of fabricating an embedded ferroelectric memory cell.

BACKGROUND

Today, in the semiconductor device fabrication industry and electronics industry several trends ore driving the development of new material technologies. First, devices (e.g. portable personal devices) are continuously getting smaller and requiring less power. Second, in addition to being smaller and more portable, these devices require more computational power and on-chip memory. In light of these trends, there is a need in the industry to provide a computational device that has a relatively large memory capacity and transistor functionality integrated onto the semiconductor chip. Preferably, this computational device will include a non-volatile memory so that if the battery dies, the contents of the memory will be retained. Examples of conventional non-volatile memories include electrically erasable, programmable read only memories ("EEPROM") and flash EEPROMs.

A ferroelectric memory (FeRAM) is a non-volatile memory that utilizes a ferroelectric material as a capacitor dielectric that is situated between a bottom electrode and a top electrode. Ferroelectric materials, such as SrBi$_2$Ta$_2$O$_9$ (SBT) and Pb(Zr,Ti)O$_3$ (PZT), are being used in the fabrication of a wide variety of memory elements, including ferroelectric random access memory (FeRAM) devices. In general, ferroelectric memory elements are non-volatile because of the bistable polarization state of the ferroelectric material. In addition, ferroelectric memory elements may be programmed with relatively low voltages (e.g., less than 5 volts), and are characterized by relatively fast access times (e.g., less than 40 nanoseconds) and operational robustness over a large number of read and write cycles. These memory elements also consume relatively low power, may be densely packed, and exhibit radiation hardness.

Recent efforts to develop fabrication processes for ferroelectric materials have focused on the integration of FeRAM technology with semiconductor integrated circuit technology. Accordingly, such efforts have focused on scaling FeRAM capacitor areas, cell sizes and operating voltages downward in accordance with the scale of current integrated circuit dimensions. In addition to small lateral dimensions (i.e., dimensions parallel to the film surface), the ferroelectric dielectric must be relatively thin and must have a relatively low coercive field to achieve FeRAM devices having low operating voltages.

SUMMARY

In addition to compatible device dimensions and operating characteristics, ferroelectric device fabrication processes should be compatible with standard semiconductor integrated circuit fabrication processes in order to achieve full integration of the two different technologies. As a result, substantial production efficiencies may be achieved by integration of the relatively new ferroelectric device technologies with the more mature and standardized integrated circuit fabrication processes.

The invention features integrated circuit structures comprising a transistor level, a ferroelectric device level, a first metal level, an inter-level dielectric level and a second metal level. The transistor level includes one or more semiconductor devices disposed over a substrate and an overlying transistor isolation layer having one or more contact vias extending therethrough. The ferroelectric device level includes one or more ferroelectric capacitors and a ferroelectric isolation layer having one or more vias extending therethrough.

The invention also features methods of forming the above-described integrated circuit structures.

In a first aspect of the invention, the ferroelectric device level is disposed over the transistor isolation layer and the ferroelectric isolation layer has one or more vias that are laterally sized larger than corresponding contact vias extending through the transistor isolation layer and aligned therewith.

In a second aspect of the invention, the first metal level and the ferroelectric device level are integrated into the same level. In some embodiments in accordance with this aspect, the integrated first metal and ferroelectric device level has a thickness corresponding substantially to the ferroelectric capacitor heights. In other embodiments, the integrated first metal and ferroelectric device level may be substantially non-planar with a reduced thickness in non-capacitor regions.

In a third aspect of the invention, the ferroelectric device level is disposed over the first metal level.

In a fourth aspect of the invention, the ferroelectric device level is disposed over an inter-level dielectric level that, in turn, is disposed over the first metal level.

In a fifth aspect of the invention, the ferroelectric device level is disposed over the transistor isolation layer and the ferroelectric isolation layer has one or more vias extending through the ferroelectric isolation layer and the transistor isolation layer.

Embodiments of the invention may include one or more of the following features.

The contact vias preferably are filled with tungsten contact plugs. The ferroelectric capacitors preferably are formed over respective tungsten contact plugs.

In some embodiments, top and bottom surfaces of each of the levels are substantially planar.

Some integrated circuit structure embodiments may include other metal levels in addition to the first and second metal levels mentioned above.

Other features and advantages of the invention will become apparent from the following description, including the drawings and the claims.

DETAILED DESCRIPTION

Figure 1:
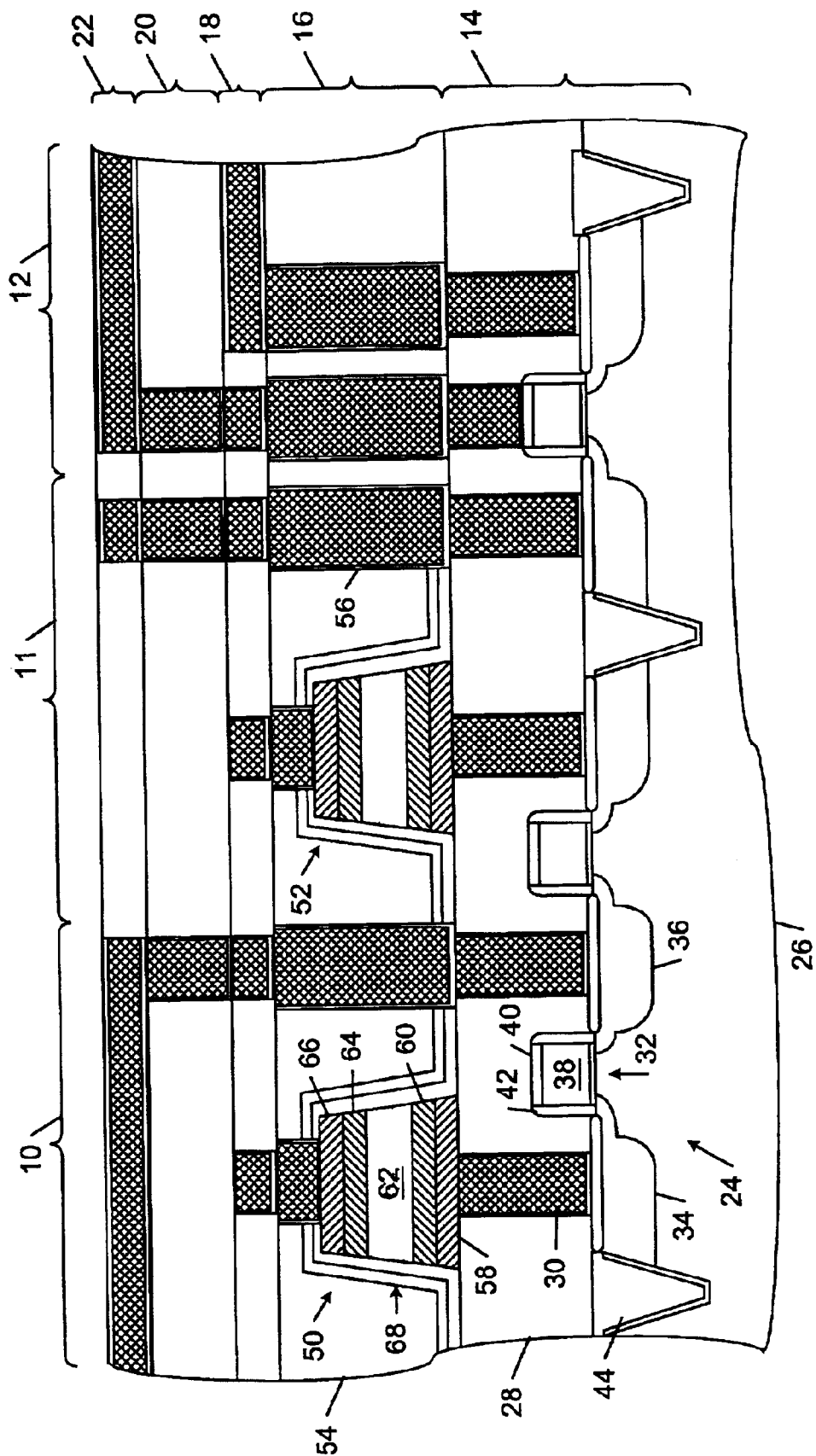
FIG. 1 is a diagrammatic cross-sectional side view of an embedded ferroelectric memory cell in which a ferroelectric device level is formed with oversized contact vias extending therethrough.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

In general, the embodiments described below include two embedded 1T-1C (one transistor—one storage capacitor) ferroelectric memory cells 10, 11 and a semiconductor device cell 12. Ferroelectric memory cells 10, 11 and semiconductor device cell 12 are formed from a series of common levels, including a transistor level 14, a ferroelectric device level 16, a first metal (or metallization) level 18, an inter-level dielectric (ILD) level 20 and a second metal (or metallization) level 22. It is noted that although the following embodiments are described in a connection with two or three metal levels, each of the embodiments may include additional metal levels depending upon the requirements of the integrated circuit structure being implemented. Levels 14–22 are formed using shared equipment and shared process facilities, with the transistor, metallization and ILD levels 14 and 18–22 being formed by standard semiconductor industry backend process steps and ferroelectric device level 16 being formed from a compatible ferroelectric device fabrication process.

The specific embodiments described below in connection with FIGS. 1, 2, 3, 4 and 5 implement different strategies for improving the yield and performance of embedded ferroelectric devices. Before these embodiments are described in detail, however, the baseline integrated fabrication process initially is described.

The Baseline Fabrication Process

The Transistor Level

Transistor level 14 includes a plurality of transistors 24 that are disposed over a substrate 26 (e.g., a single crystal silicon substrate doped n-type or p-type) and an overlying transistor isolation layer 28 having a plurality of contact vias 30 extending therethrough. In general, each transistor 24 includes a gate structure 32 and source/drain regions 34, 36. Each of the gate structures 32 includes a gate dielectric 38, a gate electrode 40, and a sidewall insulator 42. The gate dielectric 38 may be formed from silicon dioxide, an oxynitride, a silicon nitride, BST, PZT, a silicate, any other high-k material, or any combination or stack thereof. The gate electrode 40 may be formed from polycrystalline silicon doped either n-type or p-type with an overlying silicide layer or a metal, such as titanium, tungsten, TiN, tantalum or TaN. The sidewall insulator 42 may be formed from an oxide (e.g., silicon oxide), a nitride (e.g., silicon nitride), an oxynitride (e.g., silicon oxynitride), or a combination or stack thereof. The source/drain regions 34, 36 may be formed by conventional implantation techniques, and may include lightly-doped drain extensions and pocket implants. The source/drain regions 34, 36 also may be silicided (e.g., with titanium, cobalt, nickel, tungsten, or other conventional silicide material).

Transistor isolation layer 28 preferably is formed from a dielectric material (e.g., $SiO_2$, which may be doped or undoped) that may include a layer of hydrogen or deuterium containing silicon nitride near gate structures 32. In some embodiments, a diffusion barrier or etch stop layer may be formed over transistor isolation layer 28. The diffusion barrier/etch stop layer may be planarized by, for example, a conventional chemical mechanical polishing process. An additional diffusion barrier/etch stop layer may be formed over the planarized surface. Contact vias 30 are filled with conductive plugs that may be formed from a metal, such as tungsten, molybdenum, titanium, titanium nitride, tantalum nitride, or a metal silicide. A liner or barrier layer (e.g., a layer of Ti, TiN, TaSiN, Ta, TaN, TiSiN, a stack thereof, or other conventional liner/barrier material) may be formed between the conductive plugs and the dielectric material of transistor isolation layer 28. The contact vias 30 preferably are aligned with the silicided regions of source/drain regions 34, 36 and gate structures 32.

Transistor level 14 also includes a number of isolation structures 44 (e.g., conventional shallow trench isolation structures) for isolating the components of ferroelectric memory cell 10 and a semiconductor device cell 12.

The Ferroelectric Device Level

Ferroelectric device level 16 includes a pair of ferroelectric capacitors 50, 52 and a ferroelectric isolation layer 54 that has a number of vias 56 extending therethrough. Each ferroelectric capacitor 50, 52 includes a conductive barrier layer 58, a bottom electrode 60, a capacitor dielectric layer 62, a top electrode 64, and a hard mask layer 66. A sidewall diffusion barrier 68 preferably is formed over each ferroelectric capacitor stack 50, 52 to prevent diffusion of substances into and out of each stack.

Conductive barrier layer 58 may or may not be formed depending on whether the conductive plugs disposed within contact vias 30 need to be protected during subsequent processing of the capacitor dielectric layer 62. If formed, conductive barrier layer 58 preferably is formed from TiAlN or other barrier material (e.g., TaSiN, TiSiN, TiN, TaN, HfN, ZrN, HfAlN, CrN, TaAlN, CrAlN, or other conductive material). The thickness of conductive barrier layer 58 preferably is on the order of 60 nm (for a 0.18 $\mu$m via).

Conductive barrier layer 58 may be formed by reactive sputter deposition using $Ar+N_2$ or $Ar+NH_3$. Other deposition techniques that might be used include chemical vapor deposition (CVD) or plasma enhanced CVD (PECVD). For W plug contacts, it is preferred to deposit a bilayer diffusion barrier. In these embodiments, CVD TiN (e.g., 40 nm) is deposited followed by PVD TiAlN (e.g., 30 nm). In other embodiments, the diffusion barrier layer is formed from a CVD or PECVD deposition of TiAlN (e.g., 60 nm). To achieve an improved oxidation resistance, the proportion of aluminum in TiAlN preferably is 30–60% Al and, more preferably is 40–50% Al.

The bottom electrode 60 of each capacitor 50, 52 is formed either on barrier layer 58 or directly on transistor isolation layer 28 so as to make electrical connection with the underlying contact structure. Preferably, the bottom electrode 60 is approximately 25–100 nm thick, is stable in oxygen, and is formed from a noble metal or a conductive oxide (e.g., iridium, iridium oxide, Pt, Pd, $PdO_x$, Au, Ru, RuO, Rh, RhO, $LaSrCoO_3$, $(Ba,Sr)RuO_3$, $LaNiO_3$ or any stack or combination thereof). In embodiments having electrodes formed from noble metals, it is advantageous, from a cost and ease of integration standpoint, to use electrode layers that are as thin as possible. The preferred bottom electrode for a PZT capacitor dielectric is either a 50 nm thick Ir layer or a stack formed from a 30 nm thick $IrO_x$ layer and a 20 nm thick Ir layer, which may be deposited by sputter deposition for Ir (Ar) and/or reactive sputter deposition ($Ar+O_2$) for $IrO_x$. In order to control the stress of the bottom electrode 60, a post bottom electrode anneal preferably is performed for stress relaxation and/or to improve the microstructure/stability of the bottom electrode 60. Typical anneal conditions are 400–600° C. for 2–10 minutes in oxygen or inert gas mixture. This anneal may be performed at any time after the formation of the bottom electrode, but preferably is performed prior to the formation of the overlying inter-layer dielectric layers.

The capacitor dielectric layer 62 is formed over the bottom electrode 60. The capacitor dielectric layer 62 preferably is less than 150 nm thick, more preferably, is less than 100 nm thick and, most preferably, is less than 50 nm thick. Capacitor dielectric layer 62 is formed from a ferroelectric material (e.g. $Pb(Zr,Ti)O_3$ (PZT—lead zirconate titanate); doped PZT with donors (Nb, La, Ta), acceptors (Mn, Ca, Fe, Ni, Al), and/or both; PZT doped and alloyed with $SrTiO_3$, $BaTiO_3$ or $CaTiO_3$; strontium bismuth tantalate (SBT) and other layered perovskites such as strontium bismuth niobate tantalate (SBNT), or bismuth titanate; $BaTiO_3$; $PbTiO_3$; or $Bi_2TiO_3$). In embodiments having a PZT capactiro dielectric layer 62, the PZT layer way be formed as described in U.S. application Ser. No. 09/702,985, filed Oct. 31, 2000, and entitled "Method of Fabricating a Ferroelectric Memory Cell." Alternatively, the PZT capacitor dielectric layer 62 may be formed as described in U.S. application Ser. No. 09/925,223, filed Aug. 8, 2001, by Stephen R. Gilbert et al., and entitled "Forming Ferroelectric $Pb(Zr,Ti)O_3$ Films".

The top electrode 64 is formed over the capacitor dielectric layer 62. Top electrode 64 may be formed from one or more constituent layers. In some embodiments, top electrode 64 is formed from an iridium oxide layer that preferably is less than 100 nm thick and, more preferably, is less than 50 nm thick, and an iridium layer that preferably is less than 100 nm thick and, more preferably, is less than 50 nm thick. In some embodiments, top electrode 64 is annealed prior to deposition of the hardmask layer 66 in order to control the stress in the top electrode.

Preferably, the entire capacitor stack is patterned and etched at one time; preferably using a different etchant for some of the layers. Nevertheless, each layer or grouping of layers may be etched prior to the formation of a subsequent layer or layers. If multiple layers or all of the layers are etched simultaneously, then a hard mask layer 66 preferably is formed over the stack. The hard mask layer 66 may be formed from a material that is thick enough to retain its integrity during the etch process. The hardmask layer 66 preferably is approximately 50–500 nm thick, more preferably, approximately 100–300 nm thick and, most preferably, approximately 200 nm thick. Hardmask layer 66 may be formed form TiAlN, TiN, Ti, $TiO_2$, Al, $AlO_x$, AlN, TiAl, $TiAlO_x$, Ta, $TaO_x$, TaN, Cr, CrN, $CrO_x$, Zr, $ZrO_x$, ZrN, Hf, HfN, $HfO_x$, silicon oxide, a low-k dielectric, or any stack or combination thereof. An example of a hardmask stack is 300 nm of PECVD-deposited $SiO_2$ on 50 nm of sputter-deposited TiAlN or TiN. The thickness of hardmask layer 66 depends upon the capacitor stack etch process and the relative etch rates of the various capacitor stack materials, the thicknesses of the etched layers, the amount of over-etch required, and the desired remaining hardmask thickness after all of the layers have been etched. The hardmask layer 66 may or may not be removed after the capacitor stack has been etched. If hardmask layer 66 is not removed, then it is preferable to form the hardmask from a conductive material. In other embodiments, hardmask layer 66 may be formed from an insulator or a semiconductor material, in which case the interconnection to the top electrode 64 preferably is formed through hard mask layer 66 to make direct electrical connection to the top electrode 64. The deposition of the hardmask layer 66 may be a single or multilayer stack of different materials in order to better control the hardmask profile and remaining hardmask thickness. The preferred deposition process for metal nitride hard masks is sputter deposition using $Ar+N_2$ gas mixtures. The preferred deposition process for silicon oxide-containing hardmasks is TEOS PECVD.

In some embodiments, the backside and edge regions of substrate 26 are etched to reduce substantially cross-contamination by ferroelectric materials through shared equipment (e.g. steppers, metrology tools, and the like) (see, e.g. U.S. application Ser. No. 09/925,201, filed Aug. 8, 2001, by Stephen R. Gilbert et al., and entitled "Contamination Control far Embedded Ferroelectric Device Fabrication Processes".

The etch process is a dirty process and hence it is likely that the etch tool and the frontside, edge and backside of the wafers will have FeRAM contamination or have etch residues containing FeRAM contamination. Therefore, in addition to removing contamination from the backside and edge surfaces, the frontside of the wafer preferably is processed to remove etch residues. The wafer frontside also may be etched to remove a thin layer of damaged ferroelectric material from the capacitor stack. This post-capacitor-etch wet-clean may, with some etch conditions and chemistries, be as simple as a deionized water (DI water or DIW) clean (i.e., tank soak with or without megasonic followed by a spin rinse dry); the tank etch may be acid-based in order to improve the cleaning process or to remove more damaged material. The etch process also may result in redeposition of hard to etch materials, such as noble metals. For example, with Ir bottom electrodes it is possible to redeposit Ir on the sidewalls of the capacitor dielectric layer 62, which would result in unacceptably high leakage current for the capacitor. A wet clean process also may be used to remove such unwanted material using chemistries that etch some of the ferroelectric material while keeping the unwanted material in solution.

The capacitor stack may be exposed to an $O_2$ plasma to remove any damage or degradation of the ferroelectric layer that may have occurred during etching by recovering any oxygen loss that might have occurred. Alternatively, the capacitor stack may be processed by a RTA or furnace anneal in an inert or oxidizing atmosphere to add oxygen to the structure and to improve the crystallinity of the surfaces that might have been damaged by the etch process. For PZT, this anneal preferably is performed at a temperature of approximately 500–650° C. (for a furnace anneal the duration is preferably around 15 minutes to 2 hours) or at 550–700° C. (for a RTA the duration is preferably around 10–60 seconds).

The sidewalls of each ferroelectric capacitor 50, 52 preferably are steep. Sidewall diffusion barrier 68 preferably is formed on the capacitor stack prior to the formation of ferroelectric isolation layer 54 and the etching of the interconnection vias 56. The sidewall diffusion barrier 68 allows for some misalignment of the vias without shorting the capacitor, it protects the capacitor from the diffusion of most substances into the capacitor, and it protects other structures from the out-diffusion of substances from the capacitor. In the illustrated embodiments, the sidewall diffusion barrier 68 is formed from two layers; in other embodiments, however, the sidewall diffusion barrier 68 may be formed from one or more than two layers. An etchback process may be used to pattern the innermost of the sidewall diffusion barrier layers so that only the sides of the capacitors are covered by the innermost layer. Further details regarding an exemplary etchback process that may be used to pattern the innermost sidewall diffusion barrier layer may be obtained from U.S. Pat. No. 6,211,035, which is incorporated herein by reference. In some embodiments, sidewall diffusion barrier 68 is formed from a 30 nm bottom layer of $AlO_x$, $Ta_2O_5$, AlN, $TiO_2$, $ZrO_2$, $HfO_2$, or any stack or combination thereof, and a 30 nm top layer formed from silicon nitride, AlN, or any stack or combination thereof. The constituent layer or layers of the sidewall diffusion barrier 68 may be deposited as described in U.S. application Ser. No. 09/702,985, filed Oct. 31, 2000, and entitled "Method of Fabricating a Ferroelectric Memory Cell."

Ferroelectric isolation layer 54 is formed above the sidewall diffusion barrier 68. The ferroelectric dielectric (or isolation) layer 54 preferably is formed from an oxide, FSG, PSG, BPSG, PETEOS, HDP oxide, a silicon nitride, silicon oxynitride, silicon carbide, silicon carbo-oxy-nitride, a low dielectric constant material (e.g., SiLK, porous SiLK, teflon, low-K polymer (possibly porous), aerogel, xerogel, BLACK DIAMOND, HSQ, or any other porous glass material), or a combination or stack thereof. After the ferroelectric isolation layer 54 has been deposited, the isolation layer 54 preferably is planarized by a CMP process in order to make the surface flat for subsequent lithography processing. Depending on the choice of back-end metallization, there are multiple processing options. For etched Al metallization, the primary option is for Al or W vias. For damascene metallization (Al or Cu is preferable), there is the choice of dual damascene (via and metal filled at same time) or separate metal vias (Al, Cu or W) filled prior to single damascene metal. In general, the ferroelectric isolation layer 28 and the plug materials should be compatible with the thermal budget of the FeRAM fabrication process. For example, in embodiments that include W plugs and $SiO_2$ dielectric material, the FeRAM thermal budget should not exceed a temperature of approximately 600–650° C.

The Metallization Levels

Metallization levels 18, 22 are formed by industry-standard metallization processes. The metallizations may be aluminum-based or copper-based. Aluminum-based metallizations preferably are formed by etching and include CVD tungsten plugs or Al plugs, which may be doped with Cu for improved electromigration resistance. Aluminum metallizations also may include a metal diffusion barrier that is formed from TiN or Ti. Copper-based metallizations preferably are formed using a conventional damascene process and include Cu or W plugs with Ti, TiN, TiSiN, Ta, or TaSiN diffusion barriers.

The Inter-Level Dielectric Level

The inter-level dielectric level 20 preferably is formed from an oxide, FSG, PSG, BPSG, PETEOS, HDP oxide, a silicon nitride, silicon oxynitride, silicon carbide, silicon carbo-oxy-nitride, a low dielectric constant material (e.g., SiLK, porous SiLK, teflon, low-K polymer (possibly porous), aerogel, xerogel, BLACK DIAMOND, HSQ, or any other porous glass material), or a combination or stack thereof. The top surface of inter-level dielectric level 20 preferably is planarized by a CMP process in order to make the surface flat for subsequent lithography processing. Depending on the choice of back-end metallization, there are multiple processing options. For etched Al metallization, the primary option is for Al or W vias. For damascene metallization (Al or Cu is preferable), there is the choice of dual damascene (via and metal filled at same time) or separate metal vias (Al, Cu or W) filled prior to single damascene metal. In general, the dielectric layers and plug materials should be compatible with the thermal budget of the FeRAM fabrication process. For example, in embodiments that include W plugs and $SiO_2$ dielectric material, the FeRAM thermal budget should not exceed a temperature of approximately 600–650° C.

In some embodiments, a thin dielectric layer (not shown) may be formed between the respective dielectric (or isolation) layers of the different levels 14–22. If formed, these dielectric layers preferably are formed from silicon nitride, silicon carbide, (SiCNO) or silicon oxide (e.g., a high-density plasma oxide).

Further details regarding the baseline fabrication process for each of the above-described device structures may be obtained from U.S. application Ser. No. 09/702,985, filed Oct. 31, 2000, and entitled "Method of Fabricating a Ferroelectric Memory Cell."

Component features of the baseline fabrication process described above may be selected and incorporated into a respective coherent fabrication process for implementing each of the following specific embedded ferroelectric memory cell embodiments.

Embodiments with Oversized vias Through Ferroelectric Device Level

As shown in FIG. 1, in some embodiments, the vias 56 extending through ferroelectric device level 16 may be oversized relative to industry-standard via structures in order to reduce the adverse impact of misalignment between the vias 56 of the ferroelectric device level 16 and the contact vias 30 of the transistor level 14. Vias 56 may be formed by an intentional lithography offset or by an over-etch process. In these embodiments, vias 56 preferably are tapered to reduce capacitance and misalignment sensitivity.

In these embodiments, the lateral dimensions of vias 56 are limited by electrical or physical punch-through of adjacent vias and by line spacing constraints of first metal level 18.

Embodiments with Ferroelectric Device Level Formed Over Metallization Level

Figure 2:
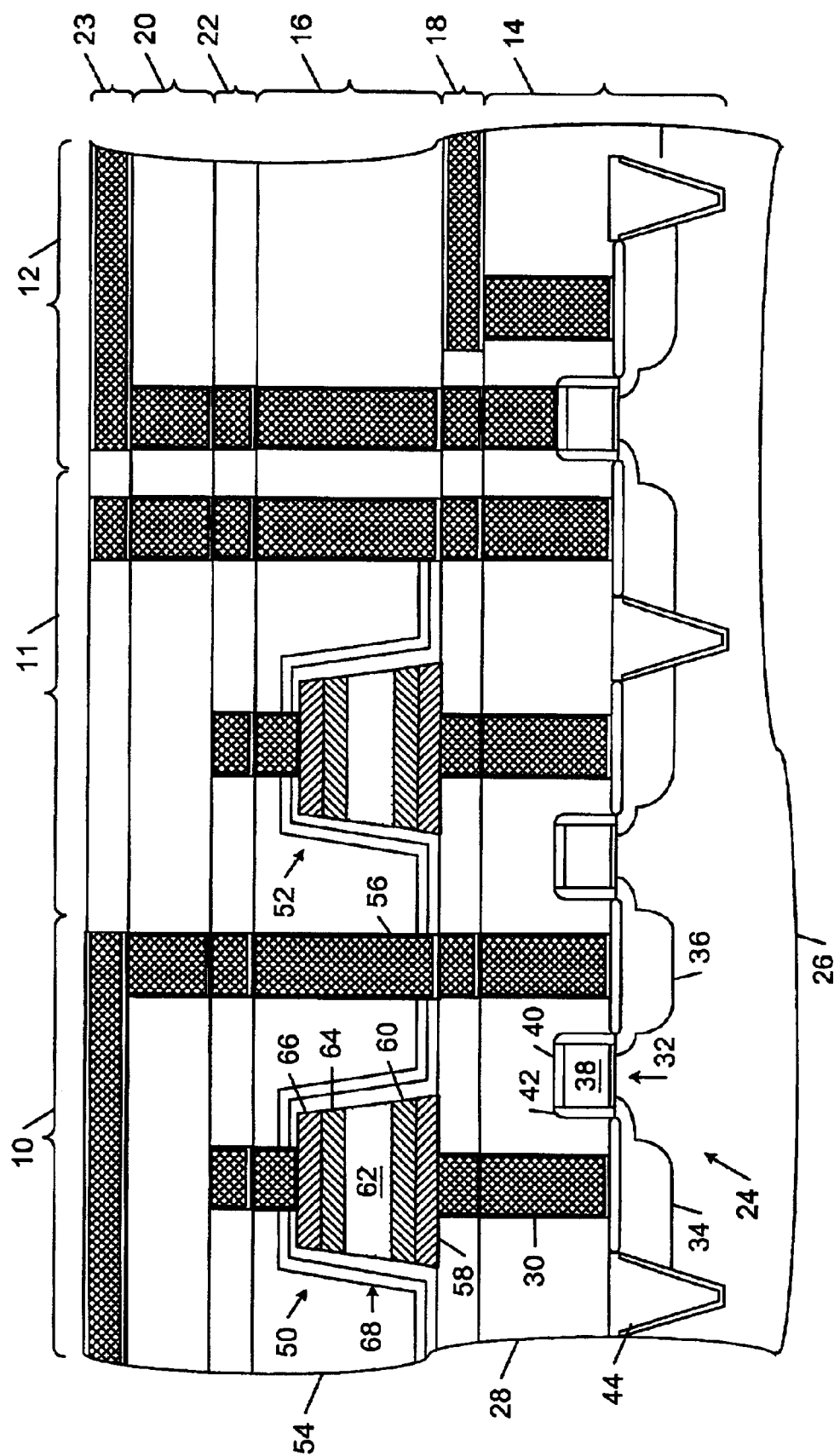
FIG. 2 is a diagrammatic cross-sectional side view of an embedded ferroelectric memory cell in which a ferroelectric device level is formed over a first metallization level.

Referring to FIG. 2, in some embodiments, ferroelectric device level 16 is formed over first metallization level 18.

After ferroelectric isolation layer 54 is formed and planarized by chemical mechanical polishing, vias 56 are etched to the top electrodes 66 of ferroelectric capacitors 50, 52 and to the contacts of the first metallization level 18. In these embodiments, first metallization level 18 must be compatible with the thermal budget of ferroelectric capacitors 50, 52. Exemplary metallization materials include tungsten and any of the barrier and electrode metals and alloys described above. In addition, ferroelectric isolation layer 54 must be compatible with the post-contact anneal required to complete ferroelectric capacitors 50, 52.

Advantageously, in these embodiments, only a single ferroelectric device level mask is added to the industry-standard back-end process flow to form the embedded ferroelectric capacitor memory cell 10. In addition, this approach eliminates any problems that might be associated with misalignment between ferroelectric device level vias and the contact plugs in transistor level 14. This approach also retains standard minimum cell dimensions and a standard thickness for first metallization level 18.

Figure 3:
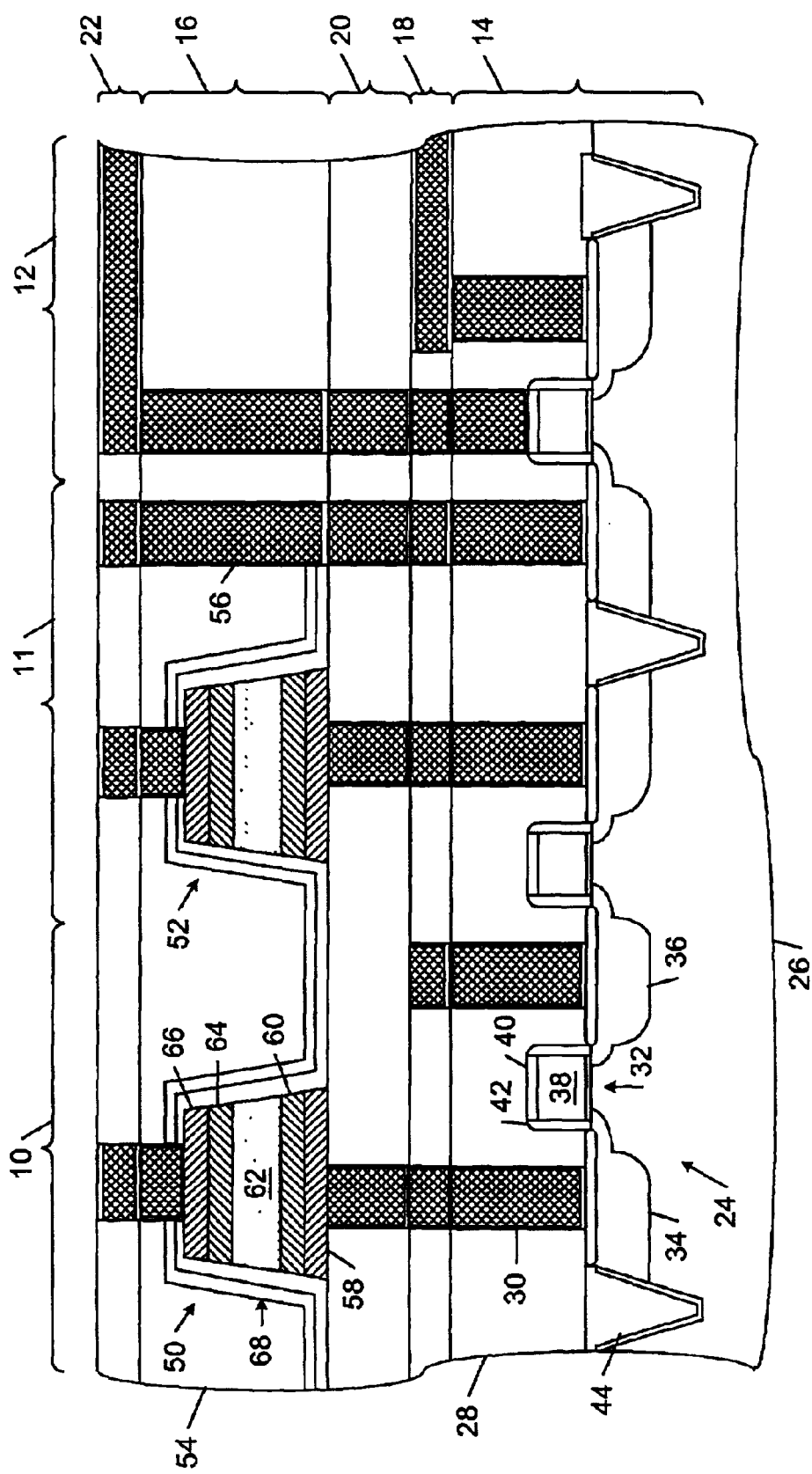
FIG. 3 is a diagrammatic cross-sectional side view of an embedded ferroelectric memory cell in which a ferroelectric device level is formed over a first metallization level and an overlying inter-level dielectric level.

Embodiments with Ferroelectric Device Level Formed Over Metallization and Inter-Level Dielectric Levels Referring to FIG. 3, in some embodiments, ferroelectric device level 16 is formed over first metallization level 18 and inter-level dielectric level 20. In these embodiments, transistor level 14, first metallization level 18 and inter-level dielectric level 20 are formed in accordance with an industry-standard back-end process flow. The inter-level dielectric level 20 is planarized by chemical mechanical polishing, and ferroelectric device level 16 is formed over the planarized inter-level dielectric level 20. After ferroelectric isolation layer 54 is formed and planarized by chemical mechanical polishing, vias 56 are etched to the top electrodes 66 of ferroelectric capacitors 50, 52 and to the top of the vias extending through inter-level dielectric level 20. In these embodiments, first metallization level 18, inter-level dielectric level 20 and ferroelectric isolation layer 54 must be compatible with the thermal budget of ferroelectric capacitors 50, 52.

Advantageously, in these embodiments, a standard first metallization thickness is retained. In addition, this approach allows ferroelectric capacitors 50, 52 to occupy a greater proportion of the area of cell 10 relative to other embodiments.

Figure 4:
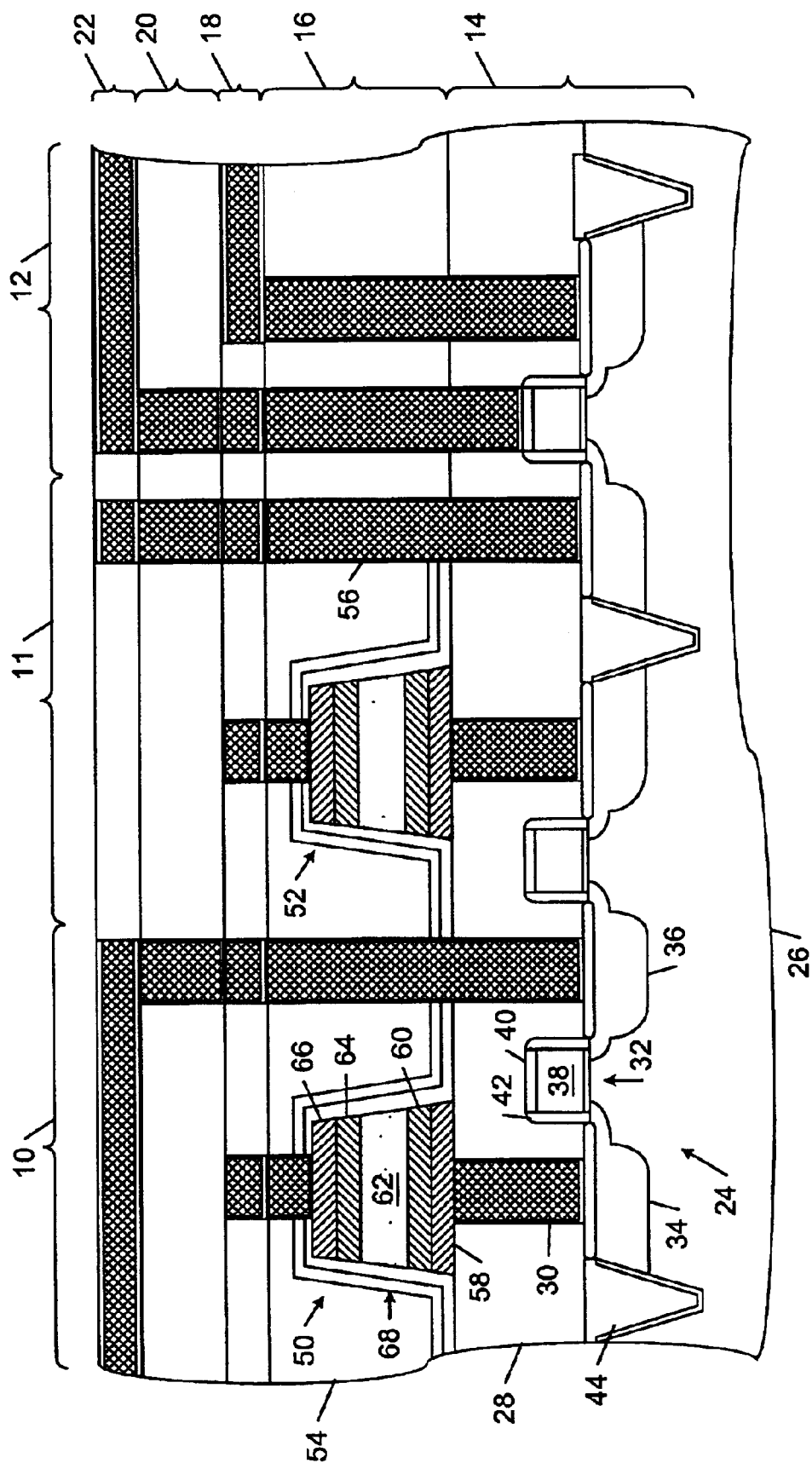
FIG. 4 is a diagrammatic cross-sectional side view of an embedded ferroelectric memory cell in which a ferroelectric device level is formed with contact vias extending through the ferroelectric device level and the transistor level.

Embodiments with vias Extending Through the Ferroelectric Device Level and the Transistor Level Referring to FIG. 4, in some embodiments, the vias 56 extending through ferroelectric device level 16 also may extend through the transistor isolation layer 28 down to the silicided regions of source/drain regions 34, 36 and gate structures 32 of transistor level 14. In this way, any problems that might be associated with misalignment between ferroelectric device level vias and the contact plugs in transistor level 14 may be avoided. After the transistor isolation layer 28 has been formed, contact vias are formed 30 are formed in the regions of ferroelectric memory cells 10, 11. Ferroelectric capacitors 50, 52 and ferroelectric isolation layer 54 then may be formed. Next, vias 56 may be formed through the ferroelectric and transistor isolation layers 54, 28 by a conventional lithography etch process. In these embodiments, vias 56 preferably are tapered to reduce capacitance and misalignment sensitivity.

Embodiments with Integrated Metallization and Ferroelectric Device Levels

Figure 5:
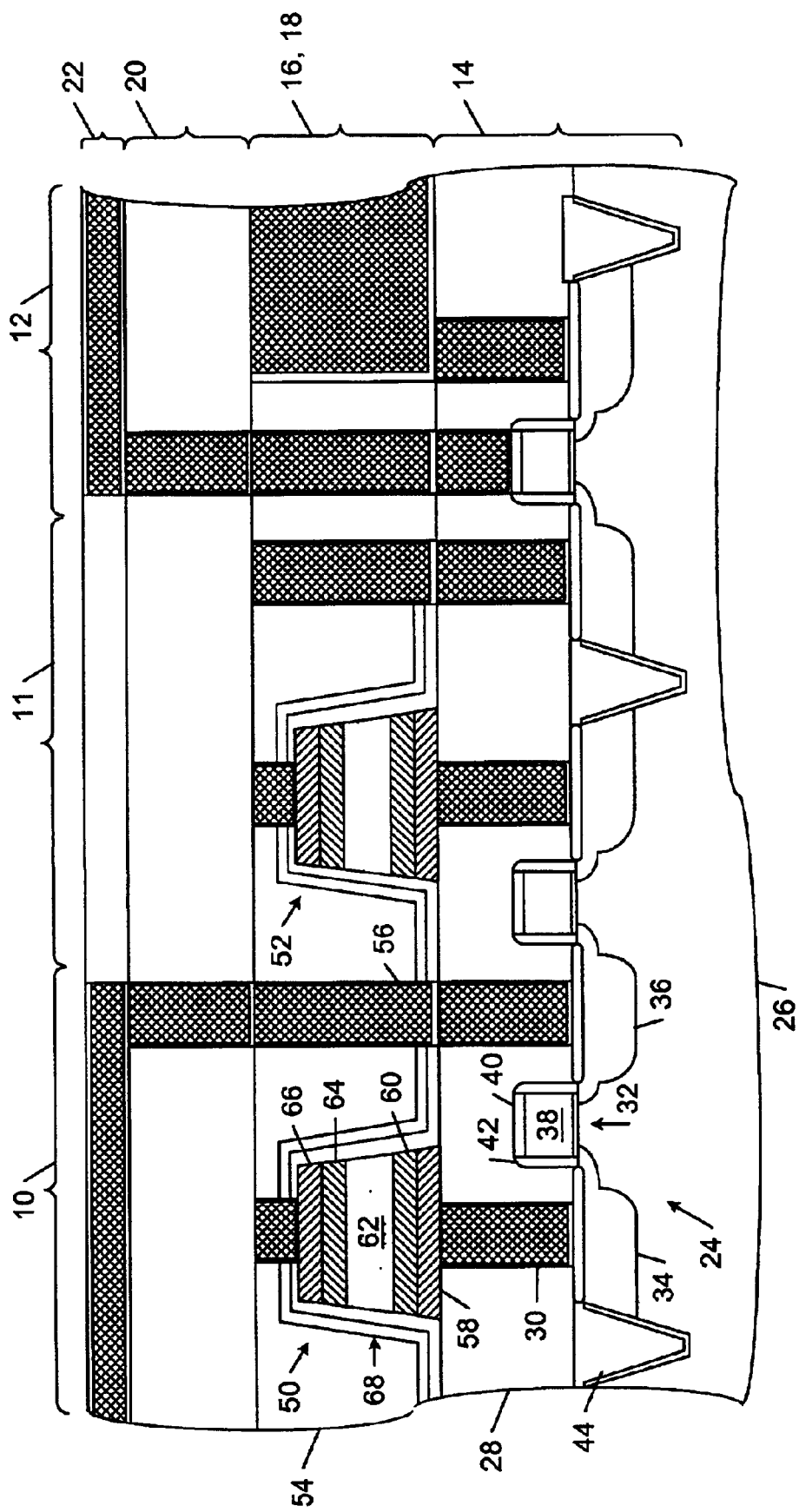
FIG. 5 is a diagrammatic cross-sectional side view of an embedded ferroelectric memory cell in which a ferroelectric device level is integrated with a first metallization level.
Figure 6:
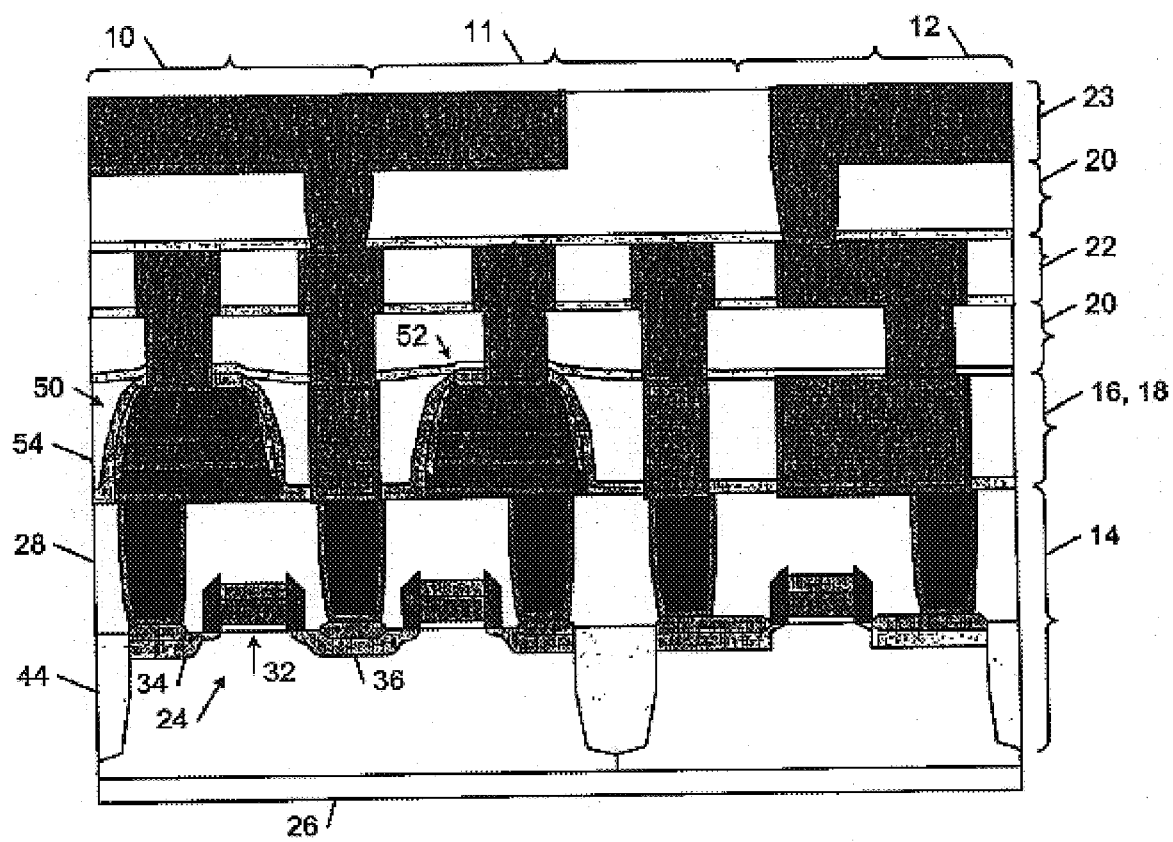
FIG. 6 is a diagrammatic cross-sectional side view of an embedded ferroelectric memory cell in which a ferroelectric device level is integrated with a first metallization level.

Referring to FIG. 5, in some embodiments, ferroelectric device level 16 and first metallization level 18 are incorporated into a single level. In these embodiments, ferroelectric capacitors 50, 52 are formed over the conductive plugs formed in contact vias 30. Ferroelectric isolation layer 54 is formed over ferroelectric capacitors 50, 52. The pattern for the first metallization level 18 then is transferred into ferroelectric isolation layer 54, as shown. The resulting surface above ferroelectric isolation layer 54 and the first metallization layer may be planarized by chemical mechanical polishing. In certain embodiments, the relatively high process temperatures needed to fabricate the ferroelectric capacitors 50, 52 may preclude the use of low-k materials in the first metallization level.

Advantageously, in these embodiments, only a single ferroelectric device level mask is added to the industry-standard back-end process flow to form the embedded ferroelectric capacitor memory cell 10. This approach also allows the total height of the integrated device structure to be reduced and eliminates any problems that might be associated with misalignment between ferroelectric device level vias and the contact plugs in transistor level 14.

Figure 7A:
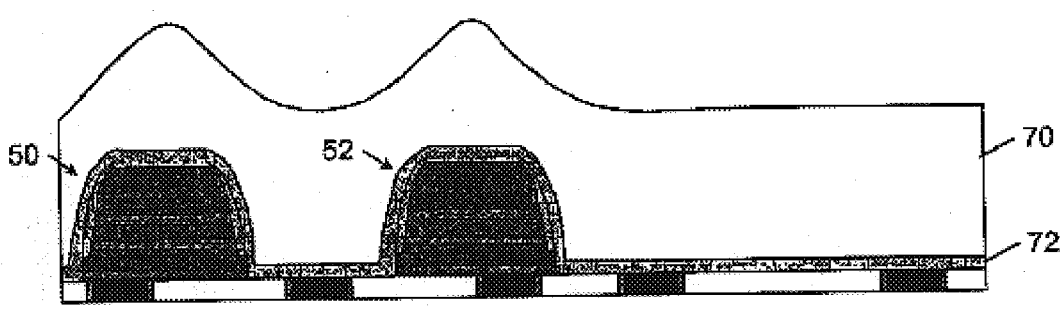
FIGS. 7A–7D are diagrammatic cross-sectional side views of the embedded ferroelectric memory cell of FIG. 6 at different stages during the process of fabricating the integrated ferroelectric device and first metallization level.
Figure 7B:
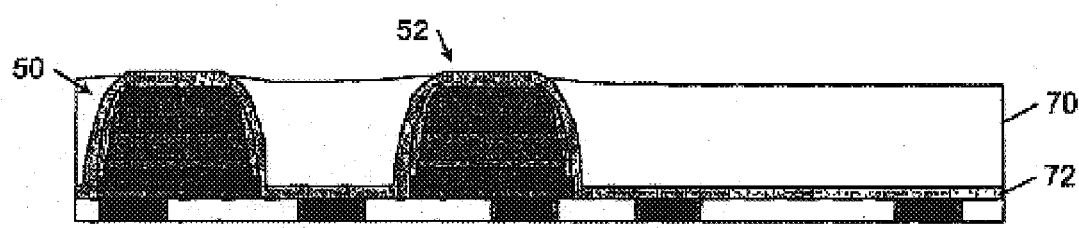
Figure 7C:
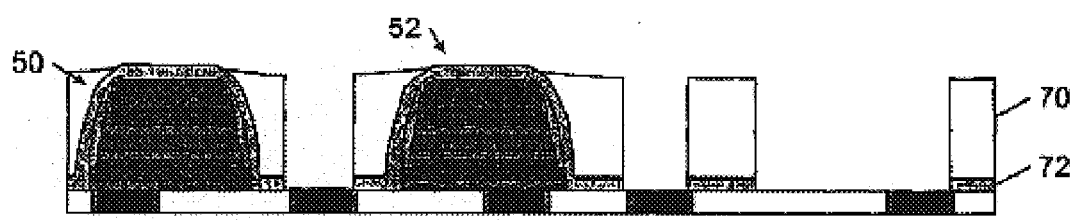
Figure 7D:
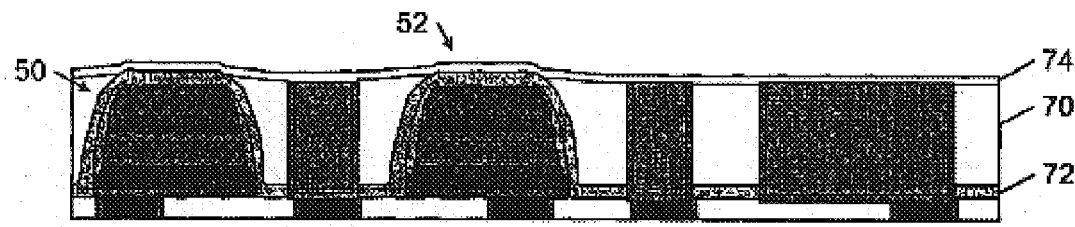
Figure 8:
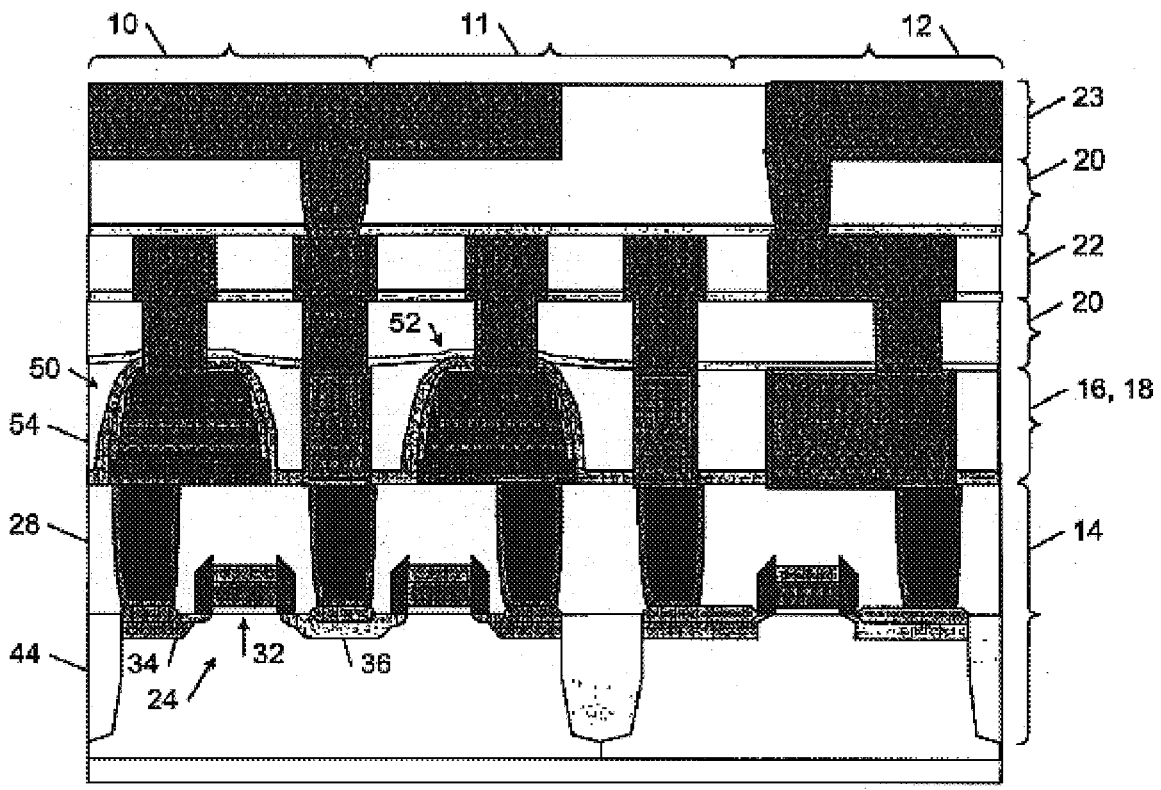
FIG. 8 is a diagrammatic cross-sectional side view of an embedded ferroelectric memory cell in which a ferroelectric device level is integrated with a first metallization level.

Referring to FIGS. 6 and 7A–7D, in one embodiment, the thickness of the combined ferroelectric device and first metallization level may be reduced to the height of the ferroelectric capacitor stacks 50, 52 by polishing an inter-metal dielectric layer down to the tops of the ferroelectric capacitor stacks 50, 52. In particular, after the ferroelectric capacitor stacks 50, 52 have been formed, an inter-metal dielectric layer 70 (e.g., HDP $SiO_2$) may be deposited over the ferroelectric capacitor stacks 50, 52 (FIG. 7A). In this embodiment, a SiN or SiC etchstop layer 72 may be disposed between the ferroelectric capacitor stacks 50, 52 and the inter-metal dielectric layer 70. The inter-metal dielectric layer 70 may be planarized, for example, by a conventional chemical mechanical polishing process, down to the etchstop layer 72 (FIG. 7B). Next, the inter-metal dielectric layer 70 is patterned lithographically and etched (FIG. 7C). The first metallization layer is formed over the etched inter-metal dielectric layer 70 and planarized, for example, by a conventional chemical mechanical polishing process (FIG. 7D). A SiN or SIC diffusion barrier 74 may be formed over the planarized first metallization layer.

Figure 9A:
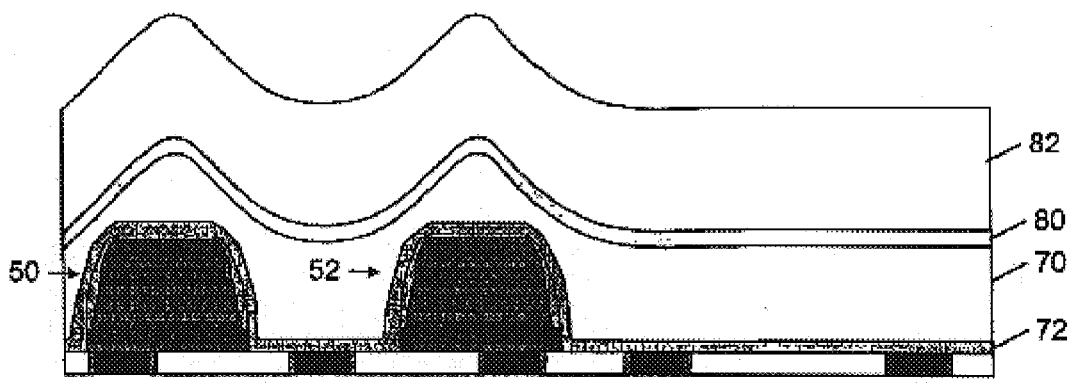
FIGS. 9A–9E are diagrammatic cross-sectional side views of the embedded ferroelectric memory cell of FIG. 8 at different stages during the process of fabricating the integrated ferroelectric device and first metallization level.
Figure 9B:
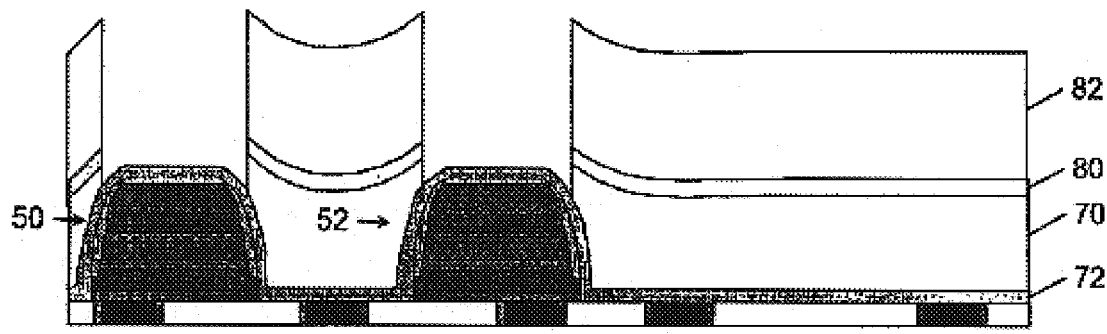
Figure 9C:
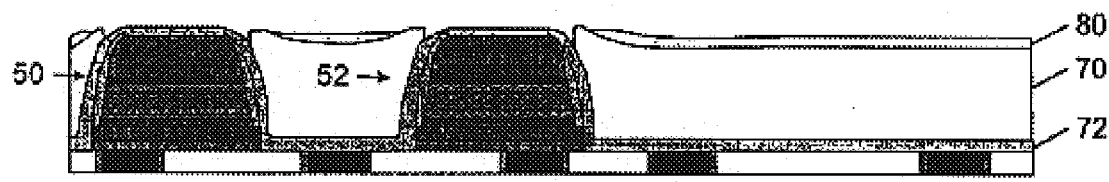
Figure 9D:
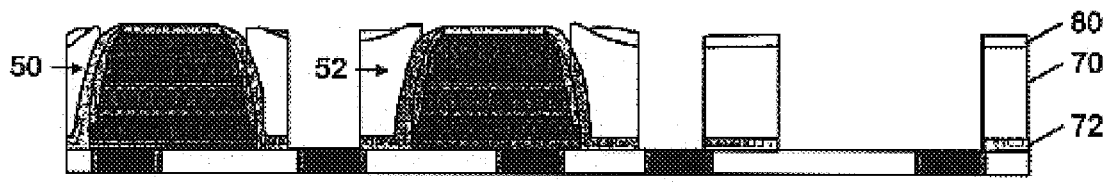
Figure 9E:
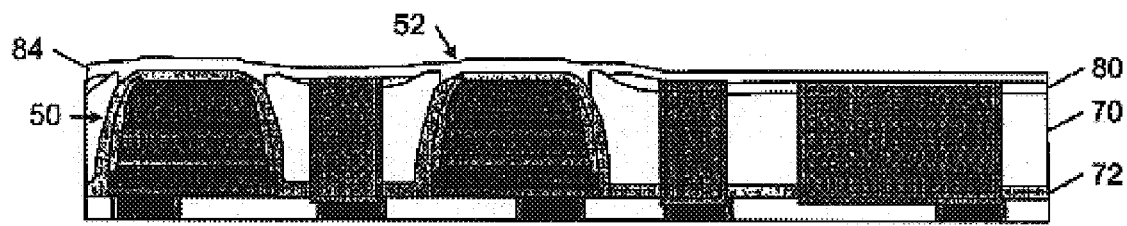

Referring to FIGS. 8 and 9A–9E, in another embodiment, a sacrificial layer may be used in the formation of the combined ferroelectric device and first metallization level to reduce its thickness to the height of the ferroelectric capacitor stacks 50, 52. As shown in FIG. 9A, after the ferroelectric capacitor stacks 50, 52 have been formed, an inter-metal dielectric layer 70 may be deposited over the ferroelectric capacitor stacks 50, 52. A SiN or SiC etchstop layer 80 maybe formed over the inter-metal dielectric layer 70 (e.g., HDP $SiO_2$), and a sacrificial layer 82 (e.g., PETEOS) may be formed over the etchstop layer 80. In this embodiment, a SiN or SiC etchstop layer 72 may be disposed between the ferroelectric capacitor stacks 50, 52 and the inter-metal dielectric layer 70. The sacrificial layer 82, etchstop layer 80 and inter-metal dielectric layer 70 may be patterned lithographically and etched down to the tops of the ferroelectric capacitor stacks 50, 52, as shown in FIG. 9B. In some embodiments, only the sacrificial layer 82 and the etchstop layer 80 are etched through, leaving at least some of the inter-metal dielectric layer 70 disposed over the ferroelectric capacitor stacks 50, 52. Next, the structure is planarized, for example, by a conventional chemical mechanical polishing process, down to etchstop layer 80 and the portion of etchstop layer 70 disposed over the top portions of ferroelectric capacitor stacks 50, 52 (FIG. 9C). The inter-metal dielectric layer 70 is patterned lithographically and etched (FIG. 9D). The first metallization layer is formed over the etched inter-metal dielectric layer 70 and planarized, for example, by a conventional chemical mechanical polishing process (FIG. 9E). A SiN or SIC diffusion barrier 84 may be formed over the planarized first metallization layer.

Figure 10:
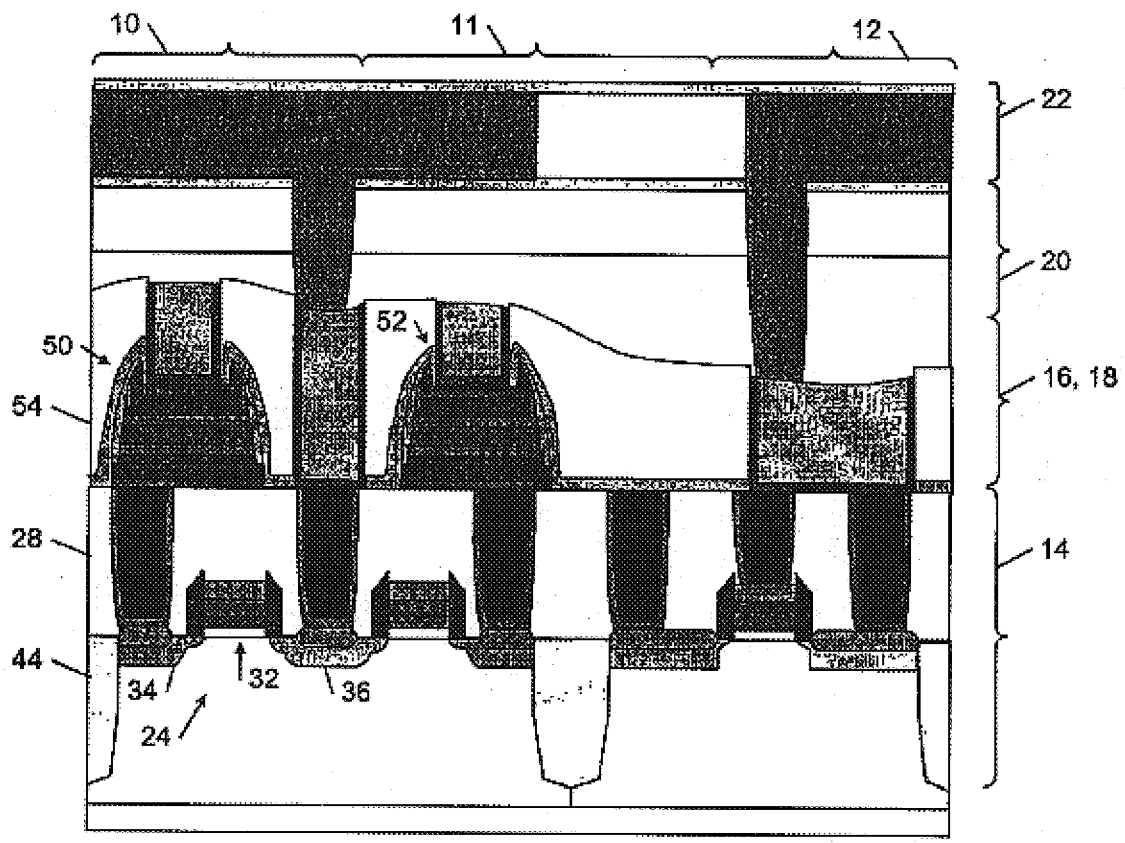
FIG. 10 is a diagrammatic cross-sectional side view of a ferroelectric memory cell with a non-planar ferroelectric level.

As shown in FIG. 10, in some embodiments, the thickness of the combined ferroelectric device and first metallization level may be reduced selectively over the relatively high device density areas of semiconductor device cells 12 to produce a non-planar level. In these embodiments, the relatively high device density areas may be selectively reduced by, for example, a chemical mechanical polishing process in which a rough slurry or a soft polishing pad is used so that the polishing rate is responsive to the underlying device topology. The overall circuit structure may be planarized at the inter-level dielectric level 20, as shown.

Other embodiments are within the scope of the claims.

For example, although the above-described embodiments are described in connection with single capacitor memory cells (i.e., 1T/1C or 1C memory cells), the fabrication processes and structures described herein also may be used to fabricate dual capacitor memory cells (i.e., 2T/2C or 2C memory cells), stand-alone FeRAM devices and other ferroelectric devices that are integrated into a standard semiconductor device fabrication process.

In addition, in embodiments in which planarity is not required, the ferroelectric devices may be formed without the dielectric planarization layers, in which case the region of ferroelectric memory cell 10 would be higher than the region of semiconductor device cell 12.

Other embodiments may incorporate one or more features of two or more of the above-described specific embedded ferroelectric memory cell embodiments of FIGS. 1–10.

Still other embodiments are within the scope of the claims.

What is claimed is:

1. An integrated circuit comprising:

a transistor level comprising one or more semiconductor devices disposed over a substrate and an overlying transistor isolation structure having at least one contact via extending therethrough;

a ferroelectric device level positioned over the transistor isolation layer, the ferroelectric device level completely encompassing at least one ferroelectric capacitor structure comprising a top electrode having an electrical contact area, a bottom electrode and ferroelectric dielectric material disposed between the top and bottom electrodes, the ferroelectric device level further including a ferroelectric isolation structure disposed over at least a portion of the top electrode of the at least one ferroelectric capacitor structure and electrically isolating non-electrical contact areas of the at least one ferroelectric capacitor structure from overlying and adjacent electrical structures, the ferroelectric isolation structure having at least one via extending therethrough and aligned with a corresponding contact via of the transistor isolation layer, the at least one via extending through the ferroelectric isolation structure being laterally sized larger than the corresponding contact via of the transistor isolation structure aligned therewith;

a first wiring level disposed over the ferroelectric device level;

an inter-level dielectric level disposed over the first wiring level; and a second wiring level disposed over the inter-level dielectric level.

2. An integrated circuit, as defined in claim 1, wherein each contact via is filled with a respective tungsten contact plug.

3. An integrated circuit, as defined in claim 2, wherein each ferroelectric capacitor structure is formed over a respective tungsten contact plug.

4. An integrated circuit, as defined in claim 1, wherein between the ferroelectric device level and the transistor isolation layer is free of any interposing wiring level.

5. An integrated circuit, as defined in claim 1, wherein throughout the ferroelectric isolation structure the at least one via extending therethrough is laterally sized larger than the corresponding contact via of the transistor isolation structure.

6. A method of forming an integrated comprising:

forming a transistor level comprising one or more semiconductor devices disposed over a substrate and an overlying transistor isolation structure having at least one contact via extending therethrough;

forming a ferroelectric device level over the transistor isolation layer, the ferroelectric device level completely encompassing at least one ferroelectric capacitor structure comprising a top electrode having an electrical contact area, a bottom electrode and ferroelectric dielectric material disposed between the top and bottom electrodes, the ferroelectric device level further including a ferroelectric isolation structure disposed over at least a portion of the top electrode of the at least one ferroelectric capacitor structure and electrically isolating non-electrical contact areas of the at least one ferroelectric capacitor structure from overlying and, adjacent electrical structures, the ferroelectric isolation structure having at least one via extending therethrough and aligned with a corresponding contact via of the transistor isolation layer, the at least one via extending through the ferroelectric isolation structure being laterally sized larger than the corresponding contact via of the transistor isolation structure aligned therewith;

forming a first wiring level over the ferroelectric device level;

forming an inter-level dielectric level over the first wiring level; and forming a second wiring level over the inter-level dielectric level.

7. A method of forming an integrated circuit, as defined in claim 6, wherein each contact via is filled with a respective tungsten contact plug.

8. A method of forming an integrated circuit, as defined in claim 7, wherein the ferroelectric capacitor is formed over a respective tungsten contact plug.

9. A method of forming an integrated circuit, as defined in claim 6, wherein between the ferroelectric device level and the transistor isolation layer is free of any interposing wiring level.

10. A method of forming an integrated circuit, as defined in claim 6, wherein throughout the ferroelectric isolation structure the at least one via extending therethrough is laterally sized larger than the corresponding contact via of the transistor isolation structure.

* * * * *